(12) United States Patent
Polleros

(10) Patent No.: US 11,363,376 B2
(45) Date of Patent: Jun. 14, 2022

(54) ACOUSTIC APPROXIMATION FOR DETERMINING EXCURSION LIMITS IN SPEAKERS

(71) Applicant: Maxim Integrated Products, Inc., San Jose, CA (US)

(72) Inventor: Robert Polleros, Sunnyvale, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 61 days.

(21) Appl. No.: 16/925,474

(22) Filed: Jul. 10, 2020

(65) Prior Publication Data

US 2021/0092516 A1   Mar. 25, 2021

Related U.S. Application Data

(60) Provisional application No. 62/902,476, filed on Sep. 19, 2019.

(51) Int. Cl.

| H04R 3/00 | (2006.01) |
|---|---|
| H04R 29/00 | (2006.01) |
| H03F 3/183 | (2006.01) |
| H03G 3/30 | (2006.01) |
| G10L 25/51 | (2013.01) |

(52) U.S. Cl.
CPC ............ H04R 3/007 (2013.01); G10L 25/51 (2013.01); H03F 3/183 (2013.01); H03G 3/3005 (2013.01); H04R 29/001 (2013.01); H03F 2200/03 (2013.01); H03G 2201/103 (2013.01)

(58) Field of Classification Search
CPC ....... H04R 3/007; H04R 29/001; G10L 25/51; H03F 3/183; H03F 2200/03; H03G 3/3005; H03G 2201/103
USPC .......................................................... 381/55
See application file for complete search history.

(56) References Cited

U.S. PATENT DOCUMENTS

| 2009/0316912 A1* | 12/2009 | De Poortere ............ H04R 3/04 381/1 |
|---|---|---|
| 2009/0316916 A1 | 12/2009 | Poortere |
| 2012/0106750 A1* | 5/2012 | Thormundsson ...... H04R 3/007 381/71.12 |
| 2013/0259245 A1 | 10/2013 | Cheng et al. |
| 2018/0114536 A1* | 4/2018 | Cassidy .................. H04R 1/22 |

FOREIGN PATENT DOCUMENTS

| CN | 101563938 A | 10/2009 |
|---|---|---|
| CN | 103369447 A | 10/2013 |

OTHER PUBLICATIONS

Chinese Office Action dated Sep. 7, 2021 for Chinese Application No. 202010984582.7. Machine Translation provided.

* cited by examiner

*Primary Examiner* — David L Ton

(57) ABSTRACT

A speaker excursion characterizing system for a speaker includes a signal generator configured to generate a signal at a plurality of different amplitudes. The signal may be generated at a plurality of frequencies. An inverse excursion filter has an inverse excursion filter response, receives the signal and applies the inverse excursion filter response and has an output in communication with an amplifier circuit of the speaker. The inverse excursion filter response is an inverse of an excursion filter response of an excursion filter in the amplifier circuit of the speaker.

17 Claims, 6 Drawing Sheets

ACOUSTIC APPROXIMATION FOR DETERMINING EXCURSION LIMITS IN SPEAKERS

CROSS-REFERENCE TO RELATED APPLICATIONS

This application claims the benefit of U.S. Provisional Application No. 62/902,476, filed on Sep. 19, 2019. The entire disclosures of the application referenced above is incorporated herein by reference.

FIELD

The present disclosure relates to speakers and more particularly to systems and methods for determining excursion limits for speakers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Mobile devices such as smartphones, laptops, tablets, etc. incorporate relatively small speakers. Designers must balance a desire for bigger sound, better sound quality, low power, and improved reliability against the increasingly smaller size of the speakers. Electromagnetic speakers include a permanent magnet and a voice coil. The voice coil is attached to a diaphragm that pushes air to create sound. The speaker is typically enclosed in a protective box that provides backside air volume for the speaker to push against and project sound. However, these types of speakers are usually are not very loud, have no bass response, and break easily. Furthermore, these speakers may be overdriven to the point of distortion and/or damage.

Excursion refers to how far a cone of a speaker linearly travels from its resting position. If a speaker is pushed beyond its physical limits, over excursion can occur and the speaker may be damaged.

SUMMARY

A speaker excursion characterizing system for a speaker includes a signal generator configured to generate a signal at a plurality of different amplitudes. An inverse excursion filter has an inverse excursion filter response, receives the signal, applies the inverse excursion filter response and has an output in communication with an amplifier circuit of the speaker. The inverse excursion filter response is an inverse of an excursion filter response of an excursion filter in the amplifier circuit of the speaker.

In other features, the signal is generated at a plurality of frequencies. The signal comprises a swept signal. The signal generator comprises a swept signal generator.

In other features, the signal generator generates a swept sinusoidal signal. A microphone senses an output of the speaker. A controller is configured to increase an amplitude of the signal and to selectively identify distortion in response to feedback from the microphone.

In other features, a speaker system includes the speaker excursion characterizing system, an amplifier circuit and the speaker. The amplifier circuit includes an input to receive an output of the inverse excursion filter. The speaker receives an output of the amplifier circuit.

In other features, the amplifier circuit includes a delay circuit to receive an input to the amplifier circuit. A variable amplifier has a variable gain and an input that receives an output of the delay circuit.

In other features, the amplifier circuit includes an excursion filter to receive the input of the amplifier circuit. A gain control amplifier has a first input that receives an output of the excursion filter, a second input that receives a voltage threshold and an output configured to control the variable gain of the variable amplifier based on the voltage threshold and the output of the excursion filter.

A speaker excursion characterizing system for a speaker includes a signal generator configured to generate a signal having a frequency. An envelope generating circuit is configured to generate an envelope signal based on at least one of the frequency of the signal and a time period that has elapsed since the signal is initiated. A multiplier is configured to receive the signal and the envelope signal and to output a product to an amplifier circuit of the speaker.

In other features, the signal is generated at a plurality of frequencies. The signal comprises a swept signal. The signal generator comprises a swept signal generator.

In other features, the signal generator generates a swept sinusoidal signal. A microphone senses an output of the speaker. A controller is configured to vary an amplitude of the envelope generating circuit and to identify distortion based on feedback from the microphone.

A speaker system includes the speaker excursion characterizing system. An amplifier circuit includes an input configured to receive an output of multiplier and an output. A speaker receives an output of the amplifier circuit.

In other features, the amplifier circuit includes a delay circuit to receive an input to the amplifier circuit. A variable amplifier has a variable gain and an input that receives an output of the delay circuit.

In other features, the amplifier circuit includes an excursion filter to receive the input of the amplifier circuit. A gain control amplifier has a first input that receives an output of the excursion filter, a second input that receives a voltage threshold and an output configured to control the variable gain of the variable amplifier.

A transducer excursion characterizing system for a transducer includes a signal generator configured to generate a signal at a plurality of different amplitudes. An inverse excursion filter has an inverse excursion filter response, receives the signal, applies the inverse excursion filter response, and has an output in communication with an amplifier circuit of a first transducer. The inverse excursion filter response is an inverse of an excursion filter response of an excursion filter in the amplifier circuit of the first transducer.

In other features, a second transducer senses an output of the first transducer. A controller is configured to increase an amplitude of the signal and to selectively identify distortion in response to feedback from the second transducer.

In other features, the signal is generated at a plurality of frequencies. The signal comprises a swept signal. The signal generator comprises a swept signal generator.

In other features, the signal generator generates a swept sinusoidal signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Excursion protection is an important aspect of speaker protection strategy. Typically, an excursion threshold of the speaker is determined. The excursion threshold is usually determined using excursion calibration equipment including a laser that directs a laser beam at a diaphragm of the speaker. As the diaphragm moves, the laser reads the physical excursion. As the diaphragm starts approaching a maximum physical excursion limit, the speaker begins to produce various audible artifacts. The excursion calibration equipment identifies the maximum physical excursion at the excursion limit.

Mass deployment of speaker protection systems requires mass deployment of the excursion calibration equipment and/or other accompanying instruments that assist in calibrating speaker protection systems. This approach tends to be cost prohibitive since the excursion calibration equipment is expensive and the process is time consuming and requires special training.

Systems and methods described herein provide an alternative to the expensive excursion calibration equipment. Rather than using the laser and related components, the systems and methods according to the present disclosure generate audible signals at various excursion limits to determine the physical excursion limit of the speaker under investigation. This helps customers to tune their audio systems quickly without requiring the more expensive excursion calibration equipment.

Systems and methods according to the present disclosure generate a signal at successively increasing amplitudes. In other words, the amplitude is increased until distortions are heard (or measured via microphone). The distortion indicates a collision between moving and static parts of the speaker, which means the excursion range is exceeded at the current amplitude.

An inverse excursion filter receives the signal and offsets a frequency response of an excursion filter located in an amplifier circuit of the speaker. When the amplitude of the signal causes detectable distortion, a voltage threshold that is used by the amplifier circuit is set based on the amplitude of the signal when the distortion is detected. The voltage threshold is used as a reference to determine when to reduce the gain of the amplifier circuit for the speaker. In some examples, the signal can be a swept signal generated by the signal generator. In other examples, the swept signal can be a swept sinusoidal signal.

Figure 1:
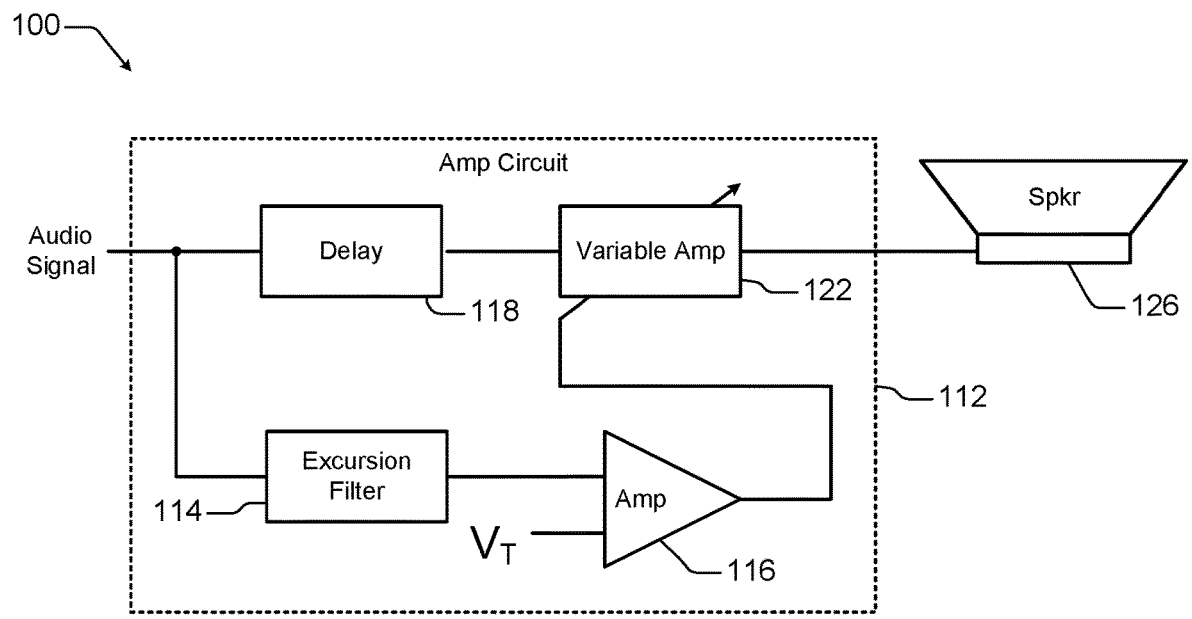
FIG. 1 is a functional block diagram of an example of an amplifier circuit and a speaker.
Figure 2:
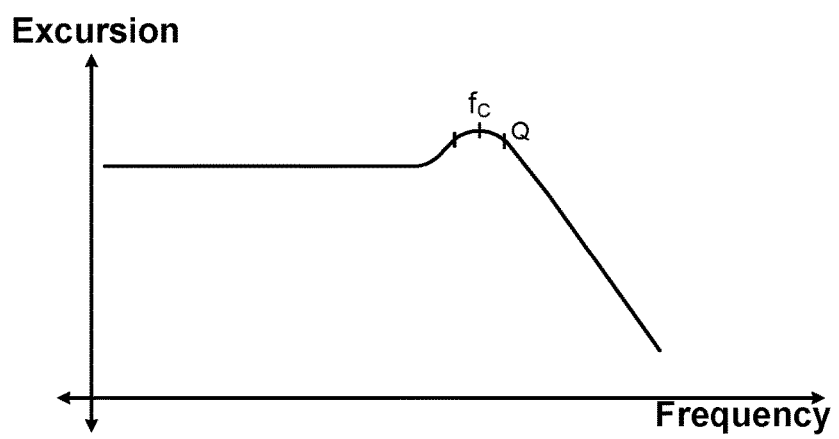
FIG. 2 is a graph illustrating an example of a filter response of an excursion filter.

Referring now to FIGS. 1 and 2, an audio system 100 includes an amplifier circuit 112 and a speaker 126. Although a speaker 126 is depicted in the FIGs, the present application is not limited to the speaker 126 depicted and 126 may comprise a transducer including but not limited to a dynamic driver, a moving coil driver, a balanced armature driver, a planar magnetic driver, an electrostatic driver, and a magneto restrictive driver, for example. The amplifier circuit 112 includes an excursion filter 114 that receives an audio signal. The amplifier circuit 112 further includes a gain control amplifier 116. One input of the gain control amplifier 116 is connected to a reference voltage threshold VT. Another input of the gain control amplifier 116 is connected to an output of the excursion filter 114.

The audio signal is also input to a delay circuit 118. An output of the delay circuit 118 is input to a variable gain amplifier 122. The variable gain amplifier 122 has a gain control input that can be varied to control a gain of the variable gain amplifier 122. Increasing the gain increases the amplification of the input signal while reducing the gain decreases the amplification of the input signal.

An output of the gain control amplifier 116 is connected to a gain control input of the variable gain amplifier 122. An output of the variable gain amplifier 122 is connected to a motive element of the speaker 126 (e.g., a coil, voice coil or other driving structure). As the input to the gain control amplifier 116 increases relative to VT, the gain of the variable gain amplifier 122 is reduced and vice versa.

In FIG. 2, an example of a filter response of an excursion filter is shown. The graph shows excursion as a function of frequency with constant voltage. In this example, the filter response is a low pass response with a frequency fo and Q. While a low pass filter response is shown, other filter responses can be used. The excursion filter 114 has a transfer function H(z)=Y(z)/X(z), where Y(z) and X(z) are z transforms of the filter output and the filter input. Numerator roots of the transfer function H(z) define zeros and denominator roots of the transfer function H(z) define poles. The filter response of the excursion filter 114 is determined by the poles and zeroes of the transfer function H(z).

Figure 3:
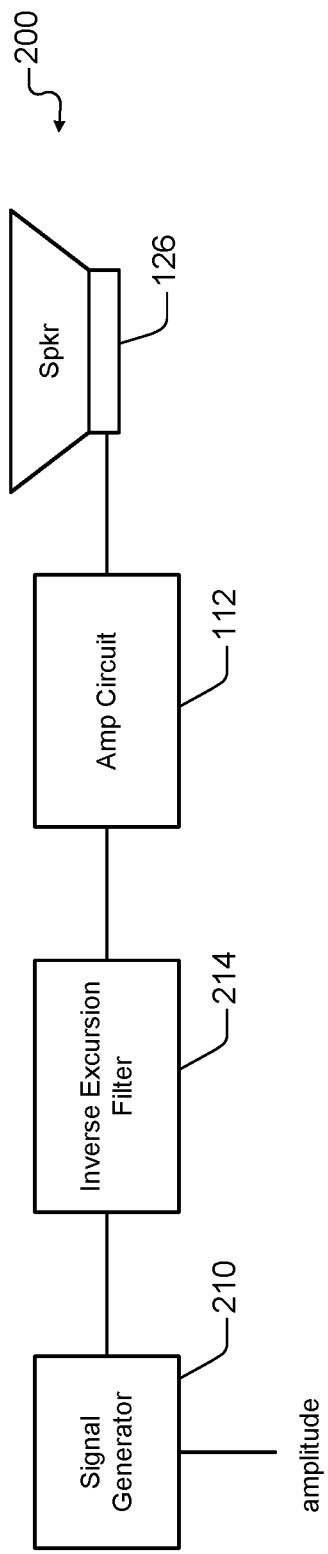
FIG. 3 is a functional block diagram of an example of a speaker excursion characterizing system according to the present disclosure.
Figure 4:
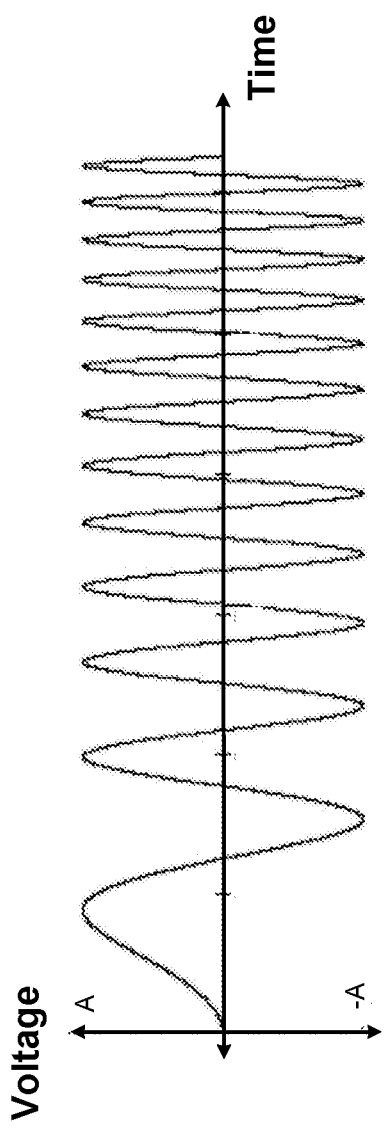
FIG. 4 is a graph of an example of a signal.

Referring now to FIGS. 3 to 5, a speaker excursion characterizing system 200 is shown. In FIG. 3, the speaker excursion characterizing system 200 includes a signal generator 210 that generates a signal. An amplitude of the signal may manually or automatically increase after each iteration (or after S iterations where S is an integer greater than or equal to 1).

In some examples, the signal has a constant amplitude during each iteration and a monotonically increasing (or decreasing) frequency during each iteration. In some examples, an amplitude of a swept signal may manually or automatically increase after each sweep (or after S sweeps where S is an integer greater than or equal to 1). In some examples, the frequency range of the signal generator 210 is in all or a part of an audible frequency range from 20 Hz to 20,000 Hz. An output of the signal generator 210 is input to an inverse excursion filter 214.

In FIG. 4, an example of a signal at the output of the signal generator is shown. In some examples, the signal includes a swept sinusoidal signal, although other types of signals can be used. The swept sinusoidal signal has a constant amplitude during each sweep and an increasing (or decreasing) frequency during each sweep. The amplitude of the swept signal is increased after one or more sweeps until distortion is detected.

Figure 5A:
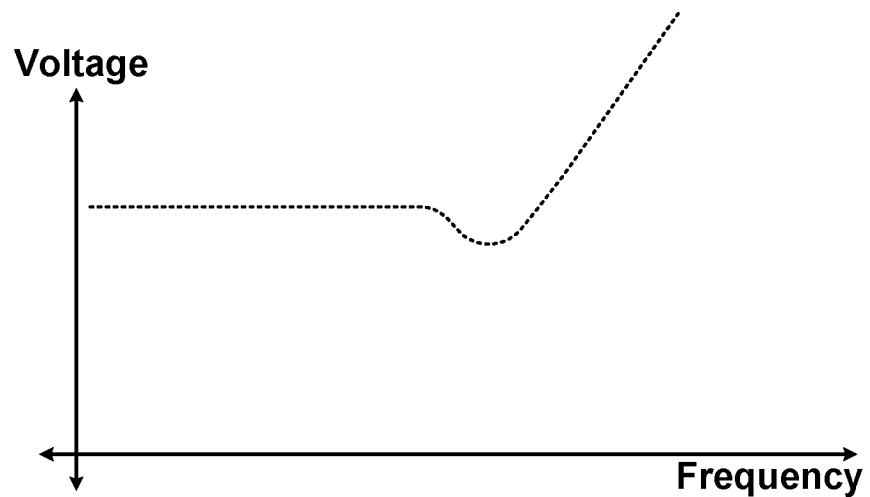
FIG. 5A is a graph of an example of a filter response of an inverse excursion filter according to the present disclosure.
Figure 5B:
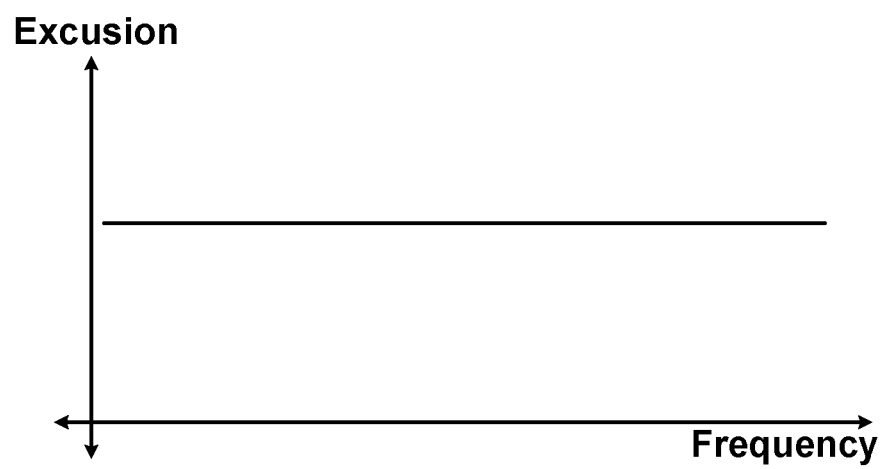
FIG. 5B shows excursion response using the inverse excursion filter according to the present disclosure.

In FIG. 5A, the inverse excursion filter 214 provides an inverse of a response of the excursion filter 114 in the amplifier circuit 112. In the graph, voltage is shown as a function of frequency. In some examples, the poles and the zeros of the transfer function H(z) of the excursion filter 114 are swapped to provide an inverse response (as shown in FIG. 5A) in the inverse excursion filter 214. In other words, the poles and zeroes of the excursion filter 114 correspond to the zeroes and poles of the inverse excursion filter 214, respectively. An output of the inverse excursion filter 214 is input to the amplifier circuit 112, which outputs a signal to the speaker 126. In some examples, an amplitude of the signal generator 210 is set by an input voltage. The amplitude of the signal generator 210 is manually or automatically increased during characterization until distortion is detected. The threshold of gain control amplifier 116 is set based on the amplitude of the signal generator 210 when distortion is detected. In FIG. 5B, excursion is shown for one of the sweeps. The inverse excursion filter flattens excursion as a function of frequency.

Figure 6:
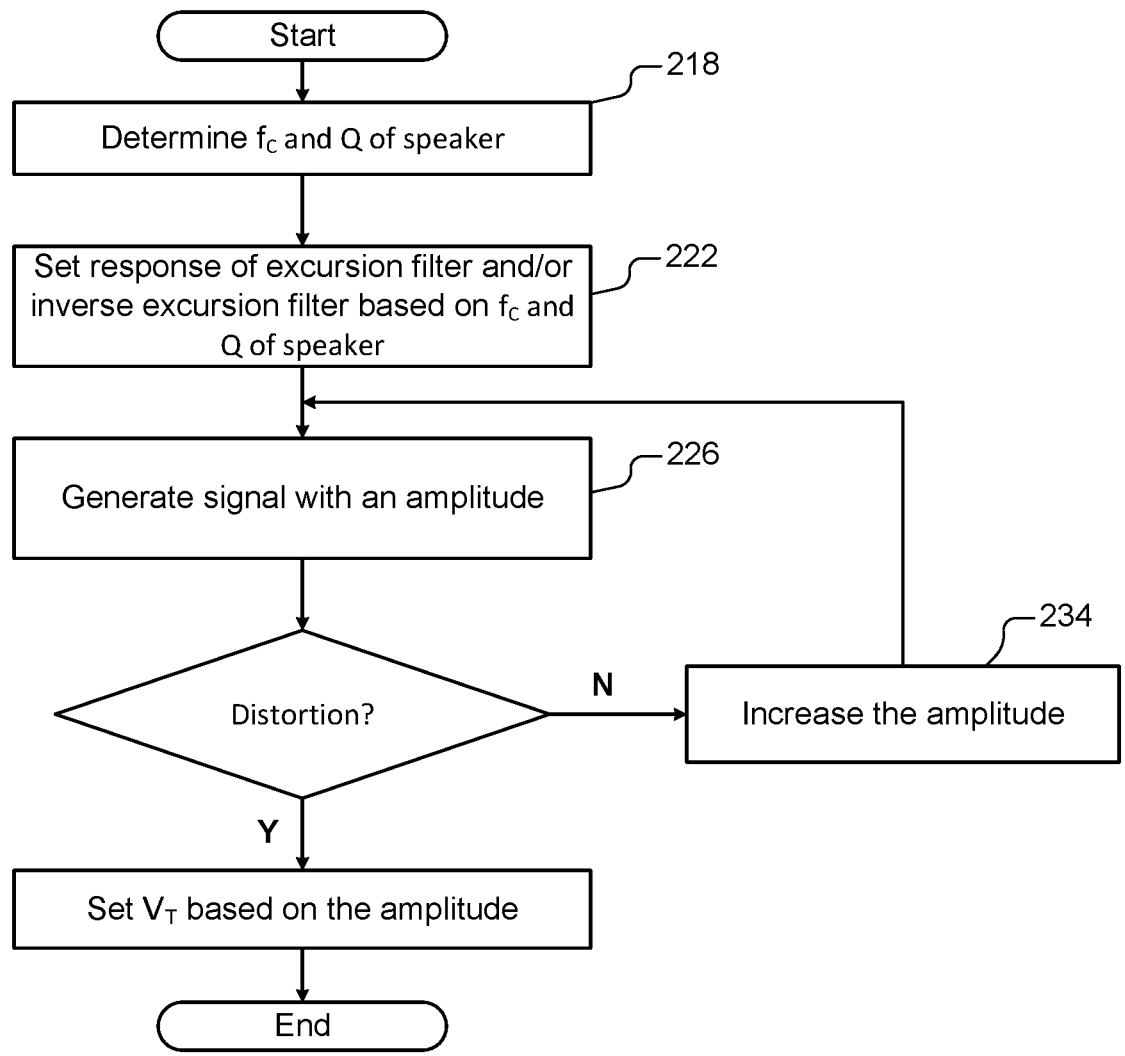
FIG. 6 is a flowchart of an example of a method for characterizing speaker excursion according to the present disclosure.

Referring now to FIG. 6, a method for characterizing speaker excursion is shown. At 218, $f_c$ and Q of the speaker 126 are determined. At 222, a response of the excursion filter and/or the inverse excursion filter are determined based on the $f_c$ and Q of the speaker 126. At 226, a signal is generated with an amplitude. At 230, the method determines whether distortion occurs. In some examples, an output of the speaker 126 is sampled by a microphone or other type of transducer configured to receive an audio output (e.g., changes in air pressure or sound pressure level (SPL)) generated by the speaker 126, and a controller to detect distortion. In other examples, an operator listens to the speaker to audibly identify distortion.

If distortion is not detected at 230, the amplitude is increased at 234 and the method returns to 226. In some examples, the amplitude is monotonically increased from one level to another level, although another approach may be used. If distortion is detected at 230, the voltage threshold for the speaker VT is set based on the amplitude when distortion is detected or heard by the operator.

Figure 7:
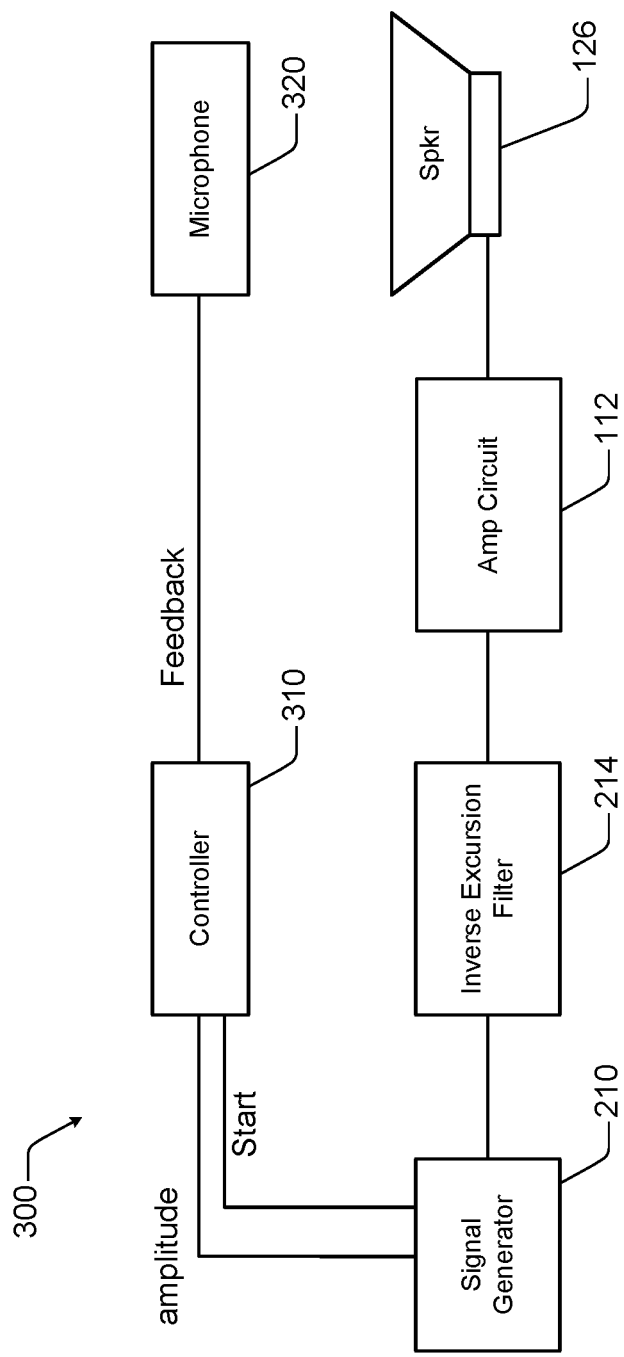
FIG. 7 is a functional block diagram of another example of a speaker excursion characterizing system according to the present disclosure.

Referring now to FIG. 7, a speaker excursion characterizing system 300 is shown. The speaker excursion characterizing system 300 further includes a controller 310 and a microphone 320. The controller 310 initiates the signal generator 210 and determines the amplitude. The controller 310 triggers the signal generator using one value for the amplitude. If distortion is not detected, the controller increases or otherwise adjusts the amplitude and checks for distortion again. The process is repeated until the controller or the operator detects distortion. The microphone 320 receives audio output from the speaker 126 and generates a feedback signal for the controller 310.

Figure 8:
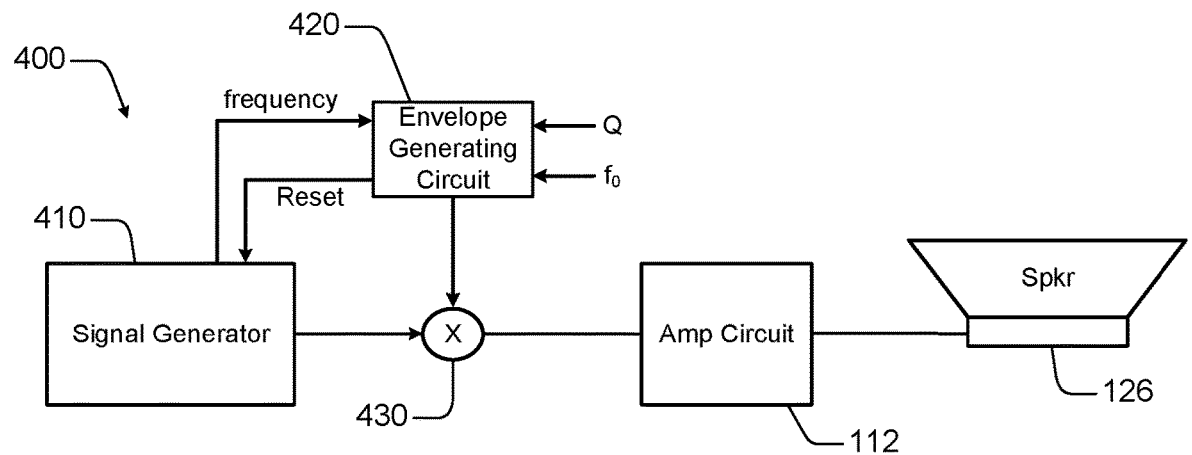
FIG. 8 is a functional block diagram of another example of a speaker excursion characterizing system according to the present disclosure.
Figure 9:
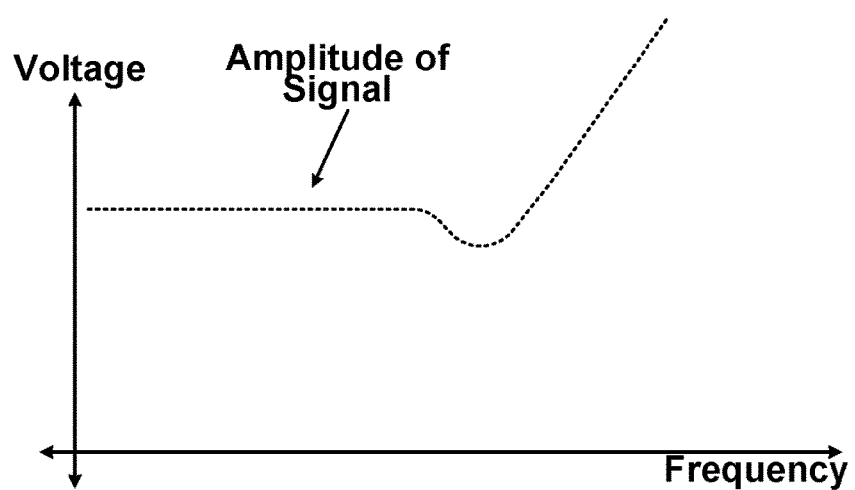
FIG. 9 is a graph of an example of an envelope generating circuit according to the present disclosure.

Referring now to FIGS. 8 and 9, a speaker excursion characterizing system 400 is shown. The input to the amplifier circuit 112 can be generated in other ways without using the inverse excursion filter. For example, a signal generator 410 outputs a signal representing a current frequency of the signal generator 410. An envelope generating circuit 420 generates an amplitude signal based on a desired amplitude of the signal as a function of the current frequency. In some examples, the envelope generating circuit 420 may employ a lookup table, formula or other approach for generating the envelope as a function of a frequency of the swept signal. Alternately, the envelope generating circuit 420 can generate the envelope based on a time period that has elapsed after the signal is initiated.

The outputs of the signal generator 410 and the envelope generating circuit 420 are multiplied by a multiplier 430 and output to an amplifier circuit 112. When the maximum frequency is reached, the envelope generating circuit 420 resets the signal generator 410 and increases the envelope signal relative to a prior iteration.

In FIG. 9, a voltage output of the envelope generating circuit 420 is shown as a function of time. The voltage output is based on an inverse of the filter response of the excursion filter 114.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system comprising:
    an excursion characterizing system for a speaker comprising:
        a signal generator configured to generate a signal at a plurality of different amplitudes; and
        an inverse excursion filter having an inverse excursion filter response, receiving the signal, applying the inverse excursion filter response and having an output; and
        an amplifier circuit of the speaker including an input to receive the output of the inverse excursion filter, wherein the inverse excursion filter response is an inverse of an excursion filter response of an excursion filter in the amplifier circuit, and wherein the amplifier circuit includes:
            a delay circuit to receive an input to the amplifier circuit; and
            a variable amplifier having a variable gain and an input that receives an output of the delay circuit.

2. The system of claim 1, wherein the signal generator generates a swept sinusoidal signal.

3. The system of claim 1, further comprising:
    a microphone to sense an output of the speaker; and
    a controller configured to increase an amplitude of the signal and to selectively identify distortion in response to feedback from the microphone.

4. The system of claim 1, further comprising the speaker, wherein the speaker receives an output of the amplifier circuit.

5. The system of claim 1, wherein the amplifier circuit includes:
    the excursion filter to receive the input of the amplifier circuit; and
    a gain control amplifier having a first input that receives an output of the excursion filter, a second input that receives a voltage threshold and an output configured to control the variable gain of the variable amplifier based on the voltage threshold and the output of the excursion filter.

6. A speaker excursion characterizing system for a speaker, comprising:
    a signal generator configured to generate a signal having a frequency;
    an envelope generating circuit configured to generate an envelope signal based on at least one of the frequency of the signal and a time period that has elapsed since the signal is initiated;
    a multiplier configured to receive the signal and the envelope signal and to output a product to an amplifier circuit of the speaker;
    a microphone to sense an output of the speaker; and
    a controller configured to vary an amplitude of the envelope generating circuit and to identify distortion based on feedback from the microphone.

7. The speaker excursion characterizing system of claim 6, wherein the signal generator generates a swept sinusoidal signal.

8. A speaker system comprising:
    the speaker excursion characterizing system of claim 6; and
    the amplifier circuit including an input configured to receive an output of the multiplier and an output.

9. The speaker system of claim 8, further comprising the speaker, wherein the speaker receives an output of the amplifier circuit.

10. The speaker system of claim 9, wherein the amplifier circuit includes:
a delay circuit to receive an input to the amplifier circuit; and
a variable amplifier having a variable gain and an input that receives an output of the delay circuit.

11. The speaker system of claim 10, wherein the amplifier circuit includes:
an excursion filter to receive the input of the amplifier circuit; and
a gain control amplifier having a first input that receives an output of the excursion filter, a second input that receives a voltage threshold and an output configured to control the variable gain of the variable amplifier.

12. A system comprising:
an excursion characterizing system for a first transducer comprising:
a signal generator configured to generate a signal at a plurality of different amplitudes; and
an inverse excursion filter having an inverse excursion filter response, receiving the signal and applying the inverse excursion filter response and having an output; and
an amplifier circuit of the first transducer including an input to receive the output of the inverse excursion filter, wherein the inverse excursion filter response is an inverse of an excursion filter response of an excursion filter in the amplifier circuit, and wherein the amplifier circuit includes:
a delay circuit to receive an input to the amplifier circuit; and
a variable amplifier having a variable gain and an input that receives an output of the delay circuit.

13. The system of claim 12, further comprising:
a second transducer to sense an output of the first transducer; and
a controller configured to increase an amplitude of the signal and to selectively identify distortion in response to feedback from the second transducer.

14. The system of claim 12, wherein the signal generator generates a swept sinusoidal signal.

15. A system comprising:
an excursion characterizing system for a speaker comprising:
a signal generator configured to generate a signal having a plurality of frequencies at a plurality of different amplitudes; and
an inverse excursion filter having an inverse excursion filter response, receiving the signal, applying the inverse excursion filter response and having an output; and
an amplifier circuit of the speaker including an input to receive the output of the inverse excursion filter, wherein the inverse excursion filter response is an inverse of an excursion filter response of an excursion filter in the amplifier circuit, and wherein the amplifier circuit includes:
a delay circuit to receive an input to the amplifier circuit; and
a variable amplifier having a variable gain and an input that receives an output of the delay circuit.

16. The system of claim 15, wherein the signal generator generates a swept sinusoidal signal.

17. The system of claim 15, wherein the signal generator comprises a swept signal generator.

* * * * *

UNITED STATES PATENT AND TRADEMARK OFFICE
CERTIFICATE OF CORRECTION

| | |
|---|---|
| PATENT NO. | : 11,363,376 B2 |
| APPLICATION NO. | : 16/925474 |
| DATED | : June 14, 2022 |
| INVENTOR(S) | : Robert Polleros |

It is certified that error appears in the above-identified patent and that said Letters Patent is hereby corrected as shown below:

In the Specification

| | |
|---|---|
| Column 4, Detailed Description, Line 27 | Delete "VT." and insert --$V_T$.-- |
| Column 4, Detailed Description, Line 41 | Delete "VT," and insert --$V_T$,-- |
| Column 4, Detailed Description, Line 46 | Delete "fo" and insert --$f_0$-- |
| Column 5, Detailed Description, Line 51 | Delete "VT" and insert --$V_T$-- |

Signed and Sealed this
Twentieth Day of September, 2022

Katherine Kelly Vidal
*Director of the United States Patent and Trademark Office*